United States Patent
Winkler et al.

(10) Patent No.: US 9,157,025 B2
(45) Date of Patent: Oct. 13, 2015

(54) PHOSPHOR MIXTURES COMPRISING EUROPIUM-DOPED ORTHO-SILICATES

(75) Inventors: Holger Winkler, Darmstadt (DE); Andreas Benker, Lautertal (DE); Martina Hueber, Seeheim-Jugenheim (DE); Monika Kursawe, Seeheim-Jugenheim (DE); Ralf Petry, Griesheim (DE); Stefan Tews, Greifswald (DE); Tim Vosgroene, Ober-Ramstadt (DE)

(73) Assignee: MERCK PATENT GMBH, Darmstadt (DE)

(*) Notice: Subject to any disclaimer, the term of this patent is extended or adjusted under 35 U.S.C. 154(b) by 549 days.

(21) Appl. No.: 13/501,570

(22) PCT Filed: Sep. 10, 2010

(86) PCT No.: PCT/EP2010/005570
§ 371 (c)(1),
(2), (4) Date: Apr. 12, 2012

(87) PCT Pub. No.: WO2011/044974
PCT Pub. Date: Apr. 21, 2011

(65) Prior Publication Data
US 2012/0199865 A1    Aug. 9, 2012

(30) Foreign Application Priority Data

Oct. 13, 2009  (EP) ..................................... 09012949
Oct. 13, 2009  (KR) ......................... 10-2009-0097454
Dec. 24, 2009  (KR) ......................... 10-2009-0130946

(51) Int. Cl.
C09K 11/08    (2006.01)
C09K 11/77    (2006.01)
H01L 33/50    (2010.01)

(52) U.S. Cl.
CPC ........... *C09K 11/7734* (2013.01); *H01L 33/504* (2013.01)

(58) Field of Classification Search
CPC ............... C09K 11/64; C09K 11/7734; C09K 11/7774; H01L 33/504; H01L 29/24
See application file for complete search history.

(56) References Cited

U.S. PATENT DOCUMENTS 7,635,438 B2    12/2009  Tamatani et al.
2004/0104391 A1   6/2004  Maeda et al.
(Continued)

FOREIGN PATENT DOCUMENTS

DE    102007016228 A1    10/2008
DE    102009037732 A1     2/2011
(Continued)

OTHER PUBLICATIONS

International Search Report of PCT/EP2010/005570 (Jan. 14, 2011).
(Continued)

*Primary Examiner* — Andrew Coughlin
(74) *Attorney, Agent, or Firm* — Millen, White, Zelano & Branigan, P.C.

(57) ABSTRACT

The invention relates to novel phosphor mixtures comprising three or more silicate phosphors. The invention furthermore relates to the use of these mixtures in electronic and electro-optical devices, in particular in light-emitting diodes (LEDs) for backlighting applications. The invention furthermore relates to LEDs comprising the phosphors.

6 Claims, 3 Drawing Sheets

(56) References Cited

U.S. PATENT DOCUMENTS

| | | |
|---|---|---|
| 2005/0082574 A1 | 4/2005 | Tasch et al. |
| 2006/0289878 A1 | 12/2006 | Brunner et al. |
| 2007/0090381 A1 | 4/2007 | Otsuka et al. |
| 2008/0017831 A1 | 1/2008 | Tamatani et al. |
| 2010/0194263 A1 | 8/2010 | Winkler et al. |
| 2012/0146078 A1 | 6/2012 | Baumann et al. |

FOREIGN PATENT DOCUMENTS

| | | |
|---|---|---|
| EP | 1367655 A1 | 12/2003 |
| JP | 2005-277441 A | 10/2005 |
| JP | 2007-59898 A | 3/2007 |
| JP | 2008-24791 A | 2/2008 |
| WO | 2005/031797 A2 | 4/2005 |

OTHER PUBLICATIONS

K. Kakinuma, "Technology of Wide Color Gamut Backlight with Light-Emitting Diode for Liquid Crystal Display Television", Japanese Journal of Applied Physics, vol. 45, No. 5B (2006) pp. 4330-4334.

T. L. Barry, "Fluorescence of Eu2+ -Activated Phases in Binary Alkaline Earth Orthosilicate Systems", Journal of Electrochemical Society, vol. 115 (1968) pp. 1181-1184.

R. J. Xie et al., "Wide Color Gamut Backlight for Liquid Crystal Displays Using Three-Band Phosphor-Converted White Light-Emitting Diodes", Applied Physics Express, vol. 2 (2009) pp. 022401-1-022401-3.

R. Lu et al., "Color Shift Reduction of a Multi-Domain IPS-LCD Using RGB-LED Backlight", Optics Express, vol. 14, No. 13 (Jun. 26, 2006) pp. 6243-6252.

J.S. Yoo et al., "Control of Spectral Properties of Strontium-Alkaline Earth-Silicate-Europium Phosphors for LED Applications", Journal of Electrochemical Society, vol. 152, No. 5 (2005) pp. G382-G385.

Office Action dated Sep. 30, 2014 issued in corresponding application JP 2012-533496 (pp. 1-3).

English Translation Abstract of JP 2005-277441 published Oct. 6, 2005.

English Translation Abstract of JP 2007-059898 published Mar. 8, 2007.

English Translation Abstract of JP 2008-024791 published Feb. 7, 2008.

German Search Report dated Aug. 3, 2012.

PHOSPHOR MIXTURES COMPRISING EUROPIUM-DOPED ORTHO-SILICATES

FIELD OF THE INVENTION

The invention relates to novel phosphor mixtures comprising at least one silicate phosphor. The invention furthermore relates to the use of these mixtures in electronic and electro-optical devices, in particular in light-emitting diodes (LEDs). The invention furthermore relates to LEDs comprising the phosphors.

BACKGROUND AND PRIOR ART

LEDs are increasing in importance on use as backlighting in liquid-crystal displays (LC displays). These novel light sources have a number of advantages over the conventional cold cathode fluorescence lamps (CCFLs), such as longer lifetime, potential energy saving, absence of harmful ingredients (such as mercury in CCFLs).

In the past, arrangements of LEDs which emit blue, green and red light were employed as backlighting source for LC TV applications. However, this multi-chip approach has some disadvantages: it is extremely difficult to combine three different chip materials and to ensure uniformity and stability of light parameters such as colour point.

pcLEDs ("phosphor-converted LEDs") have therefore been introduced as light sources for use as backlighting. These usually comprise one green phosphor and one deep-red phosphor together with the blue light emission of an LED chip, which are matched in accordance with the transmission spectra of the coloured filter (transmission bands in the blue, green and red region of the spectrum). A set-up of this type theoretically facilitates colour gamuts which are much larger than the usual sRGB. Due to restrictions in the availability of suitable qualities, there is still a need for further optimised phosphors and/or phosphor mixtures having good colour gamuts.

Surprisingly, it has now been found that a sufficient colour gamut for backlighting applications can also be achieved by LEDs comprising a phosphor mixture which comprises three or more silicate phosphors of the formula I $$Ba_wSr_xCa_ySiO_4:zEu \qquad (I),$$

in which all indices w, x, y and z are independent of one another, with the condition that within one compound the indices w, x, y and z add up to 2 (w+x+y+z=2), and in which one or more silicate phosphors emit green light, one or more silicate phosphors emit yellow light and one or more silicate phosphors emit orange light and in which the weight ratio of green phosphor to yellow phosphor to orange phosphor is 1.8-4.0:0.1-4.0:0.8-3.0.

A first embodiment of the present invention is therefore a phosphor mixture comprising three or more silicate phosphors of the formula I $$Ba_wSr_xCa_ySiO_4:zEu \qquad (I),$$

in which all indices w, x, y and z are independent of one another, with the condition that within one compound the indices w, x, y and z add up to 2 (w+x+y+z=2), and in which one or more silicate phosphors emit green light, one or more silicate phosphors emit yellow light and one or more silicate phosphors emit orange light and in which the weight ratio of green phosphor to yellow phosphor to orange phosphor is 1.8-4.0:0.1-4.0:0.8-3.0.

A sufficient colour gamut means good coverage of the sRGB range; i.e. the coverage of the colour gamut triangle of the backlighting source including coloured filter in the CIE 1931 chromaticity diagram, where the triangle which includes the three sRGB colour points according to CIE 1931 should be as large as possible. Good coverage, which is suitable for TV applications, is achieved if more than 90% of the range, preferably more than 95% of the range, is covered.

Orthosilicates have a number of advantages over mixtures of deep-red nitrides:

They are much more widely available, less expensive and they enable matching of their fluorescence band in very small steps by slight changes in the composition of the elemental formula $(Ca,Sr,Ba)_{2-x}SiO_4:Eu_x$. This enables optimised matching of the transmission curves of the coloured filters.

In particular, it has been found, surprisingly, that by mixing of a plurality of orthosilicates, for example a greenish type with a yellow type and an orange type, the resultant mixture exhibits a broader band compared with a single orthosilicate phosphor. An LED having a broader emission band is important in order to ensure sufficient spectral power not only in the blue region (by LED chip emission) and green region (by phosphor emission), but also in the red region (by phosphor emission).

WO 02/054502 describes a phosphor mixture comprising two or three phosphors, preferably two silicate phosphors and a further phosphor (barium magnesium aluminate or strontium magnesium aluminate:Eu).

WO 2007/018569 describes a phosphor composition having at least two silicate-based phases comprising a first phase having a crystal structure which essentially corresponds to that of $(Ca,Sr,Ba,Mg,Zn)_2SiO_4$, and a second phase having a crystal structure which essentially corresponds to that of $(Ca,Sr,Ba,Mg,Zn)_3SiO_5$, where at least one phase of the composition comprises Mg and at least one of the phases of the composition comprises a dopant F, Cl, Br, S or N.

KR-2005-23990 describes an LED having a compression-moulding resin layer comprising a yellow-, green- and orange-based phosphor mixture with an amount ratio in the range from 70:20:10 to 95:4:1, preferably 75:16.8:8.2 or 80:13.6:6.4, in which at least one orthosilicate-based phosphor is used. The yellow phosphor forms the principal component of the mixture.

DETAILED DESCRIPTION OF THE INVENTION

The invention relates to a phosphor mixture comprising three or more silicate phosphors of the formula I $$Ba_wSr_xCa_ySiO_4:zEu \qquad (I),$$

in which all indices w, x, y and z are independent of one another, with the condition that within one compound the indices w, x, y and z add up to 2 (w+x+y+z=2), and in which one or more silicate phosphors emit green light, one or more silicate phosphors emit yellow light and one or more silicate phosphors emit orange light and in which the weight ratio of green phosphor to yellow phosphor to orange phosphor is 1.8-4.0:0.1-4.0:0.8-3.0, preferably 1.8-2.5:0.8-1.3:1.8-2.5.

High preference is given to a phosphor mixture comprising three or more silicate phosphors of the formula I $$Ba_wSr_xCa_ySiO_4:zEu \qquad (I),$$

in which all indices w, x, y and z are independent of one another, with the condition that within one compound the indices w, x, y and z add up to 2 (w+x+y+z=2), and in which the green-emitting phosphor is $Ba_{w1}Sr_{x1}SiO_4$: z1 Eu, where w1=0.80 to 1.85; x1=0.10 to 1.25 and z1=0.05 to 0.20, the yellow-emitting phosphor is $Ba_{w2}Sr_{x2}Ca_{y2}SiO_4:z2\,Eu$, where w2=0.10 to 0.80; x2=1.0 to 1.80; y2=0.0 to 0.2 and z2=0.05 to 0.20, the orange-emitting phosphor is $Ba_{w3}Sr_{x3}Ca_{y3}SiO_4:z3Eu$, where w3=0.03 to 0.10; x3=0.90 to 1.50; y3=0.20 to 0.80 and z3=0.05 to 0.20.

The invention furthermore relates to the process for the preparation of a phosphor mixture in which a first silicate phosphor is mixed with one or more further phosphors.

The phosphors are well-known compounds and can be prepared by conventional methods by solid-state diffusion synthesis or also by wet-chemical methods (see William M. Yen, Marvin J. Weber, Inorganic Phosphors, Compositions, Preparation and optical properties, CRC Press, New York, 2004, or WO 02/054502).

The present invention furthermore relates to a light source which comprises an indium aluminium gallium nitride semiconductor and three or more silicate phosphors comprising $Ba_wSr_xCa_ySiO_4:zEu$, in which all indices w, x, y and z are independent of one another, with the condition that within one compound the indices w, x, y and z add up to 2 (w+x+y+z=2), in which one or more silicate phosphors emit green light, one or more silicate phosphors emit yellow light and one or more silicate phosphors emit orange light, characterised in that the weight ratio of green phosphor to yellow phosphor to orange phosphor is 1.8 to 4.0:0.0 to 4.0:0.8 to 3.0, preferably 1.8 to 2.5:0.8 to 1.3:1.8 to 2.5.

The indium aluminium gallium nitride semiconductor typically has the formula $In_iGa_jAl_kN$, where $0 \leq i$, $0 \leq j$, $0 \leq k$ and $i+j+k=1$.

The light source is preferably a light-emitting diode (LED) or an LED backlight for display applications containing a blue-emitting InGaN semiconductor diode, which, in combination with corresponding conversion phosphors and preferably emits white or virtually white light. This InGaN semiconductor diode typically has an emission maximum between 430 nm and 480 nm and has very high efficiency and preferably a long lifetime with only a very slight drop in efficiency.

The phosphor layer (phosphor mixture) could preferably be arranged directly on the surface of the chip or could be distributed in a specific volume directly above and/or around the chip or could be arranged in a layer or volume at a specific distance from the chip ("remote phosphor").

The present invention furthermore relates to a backlighting system having at least one light source according to the present invention.

The backlighting system according to the invention can be, for example, a "direct-lit" backlighting system or a "side-lit" backlighting system, which has an optical waveguide and an outcoupling structure.

The backlighting system has a white light source, which is usually located in a housing, which preferably has a reflector on the inside. The backlighting system may furthermore have at least one diffuser plate.

In order to produce and display coloured images, the liquid-crystal unit is provided with a coloured filter. The coloured filter contains pixels in a mosaic-like pattern which transmit either red, green or blue light. The coloured filter is preferably arranged between the first polariser and the liquid-crystal cell.

The present invention furthermore relates to a liquid-crystal display fitted with at least one backlighting system having at least one white light source, which comprises at least one semiconductor diode, preferably blue-emitting, and at least one phosphor layer comprising a phosphor mixture as defined above.

A liquid-crystal display usually has a liquid-crystal unit and a backlighting system. The liquid-crystal unit typically comprises a first polariser and a second polariser and a liquid-crystal cell which has two transparent layers, each of which carries a matrix of light-transparent electrodes. A liquid-crystal material is arranged between the two substrates. The liquid-crystal material comprises, for example, TN (twisted nematic) liquid crystals, STN (supertwisted nematic) liquid crystals, DSTN (double supertwisted nematic) liquid crystals, FSTN (foil supertwisted nematic) liquid crystals, VAN (vertically aligned nematic) liquid crystals or OCB (optically compensated bend) liquid crystals. The liquid-crystal cell is surrounded in a sandwich-like manner by the two polarisers, where the second polariser can be seen by the observer.

Also very highly suitable for monitor applications is IPS (in-plane switching) technology. In contrast to the TN display, the electrodes in whose electric field the liquid-crystal molecules are switched are only located on one side of the liquid-crystal layer in the IPS cell. The resultant electric field is inhomogeneous and, to a first approximation, aligned parallel to the substrate surface. The molecules are correspondingly switched in the substrate plane ("in plane"), which results in a significantly lower viewing-angle dependence of the transmitted intensity compared with the TN display.

Another, less well-known technique for good optical properties over a broad viewing angle is FFS technology and a further development thereof, AFFS (advanced fringe field switching) technology. This has a similar functional principle to IPS technology.

A further aspect of the present invention relates to an electronic or electro-optical device comprising one or more phosphor mixtures as described above and below. A further aspect relates to the use of the phosphor mixtures as described above and below in an electronic or electro-optical device. Especially preferred devices are LEDs for backlighting applications.

The electronic or electro-optical device can also be, for example, an organic field-effect transistor (OFET), a thin-film transistor (TFT), an organic solar cell (O-SC), an organic laser diode (O-laser), an organic integrated circuit (O-IC), a radio-frequency identification (RFID) tag, a photodetector, a sensor, a logic circuit, a memory element, a capacitor, a charge-injection layer, a Schottky diode, a planarising layer, an antistatic film, a conducting substrate or a conducting structure, a photoconductor, an electrophotographic element or an organic light-emitting transistor (OLET).

Definition of Terms

The term "phosphor mixture" denotes a phosphor mixture in which two or more phosphors are mixed with one another to create a new composition having different physical properties.

The term "green-emitting phosphor" denotes a silicate phosphor having at least one emission maximum at a wavelength between 508 nm and 550 nm.

The term "orange-emitting phosphor" denotes a silicate phosphor having at least one emission maximum at a wavelength between 586 nm and 625 nm.

The term "yellow-emitting phosphor" or "phosphor emits yellow light" denotes a phosphor having at least one emission maximum at a wavelength between 551 nm and 585 nm.

The term "solid-state diffusion method" ("mix & fire" method) indicates that the oxidic starting materials are mixed as powders, the mixture is ground, and the ground powders are then calcined in a furnace at temperatures up to 1500° C. in an optionally reducing atmosphere for up to several days.

The term "wet-chemical methods" in accordance with the invention preferably encompasses three method variants:

In the first method variant, an organosilicon compound, preferably $Si(OEt)_4$, is added, for example, to hydroxide solutions of the corresponding phosphor starting materials and an Eu-containing dopant at elevated temperatures, which results in the formation of the phosphorescentphor precursor.

In the second method variant, so-called oxalate precipitation, firstly alkaline-earth metal halides are dissolved in water with a europium halide and added to a silicon-containing mixture consisting of a dicarboxylic acid and an inorganic or organic silicon compound. Increasing the viscosity results in the formation of the phosphor precursor.

In the third method variant, so-called hydrogencarbonate precipitation, firstly alkaline-earth metal starting materials, preferably alkaline-earth metal halides, are dissolved in water with a europium-containing dopant, and an inorganic or organic silicon-containing compound is subsequently added. The precipitation is carried out using a hydrogencarbonate solution, resulting in the slow formation of the phosphor precursor.

Finally, thermal aftertreatment (calcination) of the phosphor precursor is necessary in order to obtain the finished silicate phosphor.

Unless the context clearly indicates otherwise, the plural forms used herein of the terms used herein are to be construed as including the singular form, and vice versa.

Throughout the description and claims of this specification, the words "comprise" and "contain" and variations thereof, for example "comprising" and "comprises", mean "including but not limited to", and do not or are not intended to exclude other components.

It goes without saying that the above embodiments of the invention can be varied while still falling within the scope of protection of the invention. Each feature disclosed in this specification may, unless indicated otherwise, be replaced by alternative features serving the same, equivalent or similar purpose. Accordingly, unless indicated otherwise, each feature disclosed is only one example of a generic series of equivalent or similar features.

The invention will be described in greater detail below with reference to the following examples, which only serve for illustration and do not limit the scope of protection of the invention.

EXAMPLE 1

Preparation of Phosphor Mixture A

The following orthosilicate phosphor mixture A is synthesised by mixing the three orthosilicates as follows:

SGA 524 100 (green phosphor which emits at about 524 nm; source: Merck KGaA),

SGA 555 100 (yellow phosphor which emits at about 555 nm; source: Merck KGaA) and SGA 593 100 (orange phosphor which emits at about 593 nm; source: Merck KGaA)

in the weight ratio 2:1:2.

The three phosphors SGA 524100, 555100 and 593100 are mixed by mixing the components by means of a gyrowheel mixer at 5 revolutions per minute.

For the general conditions of the synthesis of orthosilicate phosphors, reference is made to T. L. Barry, J. Electrochem. Soc., 1968, 11811181, and U.S. Pat. No. 3,505,240. U.S. Pat. No. 3,505,240 describes, for example, the phosphor (Ba,Sr)SiO$_4$:Eu, which is prepared by mixing barium carbonate and strontium carbonate with a source of SiO$_2$ and Eu. An ammonium chloride flux is blended into the mixture, and the batch is fired to produce the phosphor. As evident from Table 1 of U.S. Pat. No. 3,505,240, the peak emission is shifted from green (505 nm) to yellow (575 nm) when, for example, the amounts of Sr$_2$SiO$_4$ taken up into the solid solution are increased, while the total mole per cent of Ba$_2$SiO$_4$ and Sr$_2$SiO$_4$ is maintained at 100%. The person skilled in the art therefore derives from the teaching of T. L. Barry, J. Electrochem. Soc., 1968, 11811181 and U.S. Pat. No. 3,505,240 how to prepare silicates having a green, yellow or orange colour.

In accordance with the present invention, the raw materials used are alkaline-earth metal carbonates, europium oxide and ammonium chloride and silicic acid. The phosphor is prepared by dry-mixing the raw materials in the requisite stoichiometric amounts. Ammonium chloride is added as flux. The mixture is transferred into an alumina crucible and transferred into a furnace. For the firing process, the sample is heated at up to 1300° C. under a reductive atmosphere for 2 to 12 hours.

EXAMPLES 2 TO 11

Preparation of Phosphor Mixtures B to M

TABLE 1

Compositions of various mixtures which are suitable for LCD back-lighting applications

| | SGA 515 100 | SGA 524 100 | SGA 540 100 | SGA 545 100 | SGA 555 100 | SGA 565 300 | SGA 587 100 | SGA 593 100 | SGA 605 100 |
|---|---|---|---|---|---|---|---|---|---|
| Blend B | | | 2.2 g | | | | 2 g | | |
| Blend C | | 2 g | | | | 1 g | | 2 g | |
| Blend A | | 2 g | | | 1 g | | | 2 g | |
| Blend D | | 2.5 g | | | | 1 g | | 2 g | |
| Blend E | | 2.5 g | | | 1 g | | | 2 g | |
| Blend F | | 2 g | | | 1 g | 1 g | 2 g | | |
| Blend G | 2 g | | | | | 1 g | | 2 g | |
| Blend H | | 2.5 g | | 1 g | | 1 g | | | 2 g |
| Blend I | | 2.5 g | | 1.3 g | | 1.2 g | | | 2.2 g |
| Blend J | 2 g | | | | | | | | 1 g |
| Blend K | | 2 g | | | | | | | 2 g |
| Blend L | | 2 g | | | | 0.2 g | | | 2 g |
| Blend M | | 2.5 g | | 1 g | | | | 2 g | |

Green phosphors are: SGA 515 100, SGA 524 100, SGA 540 100 and SGA 545 100.
Yellow phosphors are: SGA 555 100, SGA 565 100, SGA 587 100.
Orange phosphors are: SGA 593 100 and SGA 605 100.

The numbers xyz in SGA xyz 100 indicate the wavelength of the emission peak maximum.

The synthesis of the phosphors mentioned in Table 1 is carried out in accordance with the procedure described in Example 1. The phosphors are mixed in the amounts indicated in Table 1 by mixing the components by means of a gyrowheel mixer at 5 revolutions per minute.

EXAMPLE 12

Production and Characterisation of an LED and Installation in a Liquid-crystal Display The phosphor mixture from Example 1 is mixed with an OE 6550 two-component (A and B) silicone resin system from Dow Corning with the aid of a tumble mixer in such a way that equal amounts of phosphor are dispersed in component A and B (final concentration of phosphor in the silicone: 8%). In each case, 5 ml of component A and 5 ml of component B are mixed to give a homogeneous mixture and introduced into a storage vessel, which is connected to the measurement valve of a dispenser. Raw LED packages, supplied by OSA opto electronics, Berlin, consisting of bonded InGaN chips having a surface area of 1 mm$^2$ each, which emit at a wavelength of 450 nm, are fixed in the dispenser. The cavities of the raw LED packages are filled with the silicone phosphor by means of the xyz positioning of the dispenser valve. The LEDs treated in this way are then subjected to a temperature of 150° C., at which the silicone solidifies. The LEDs can then be put into operation and emit white light having a colour temperature of about 6000 K.

A common LCD TV coloured filter characteristic was used in order to simulate a display environment and to calculate the colour gamut that is achieved by this LED. The spectra of the coloured filter, the LED spectrum without and with coloured filter are given in FIG. 2. The LED spectrum with coloured filter was recorded with a coloured filter sheet between LED and detector. The characterisation of the LED was carried out using an Instruments Systems CAS 140 spectrometer.

The colour gamut coverage of the LED comprising the phosphor mixture of Example 1 is given in FIG. 3 and works out as about 98% coverage of the sRGB. A number of the LEDs produced above are then installed in a backlighting system of a liquid-crystal display.

EXAMPLES 13-23

Phosphor mixtures B-M from Examples 2-11 are used to produce LEDs and LC displays as described in Example 12.

Description of the Drawings

The invention will be explained in greater detail below with reference to illustrative embodiments.

Figure 1:
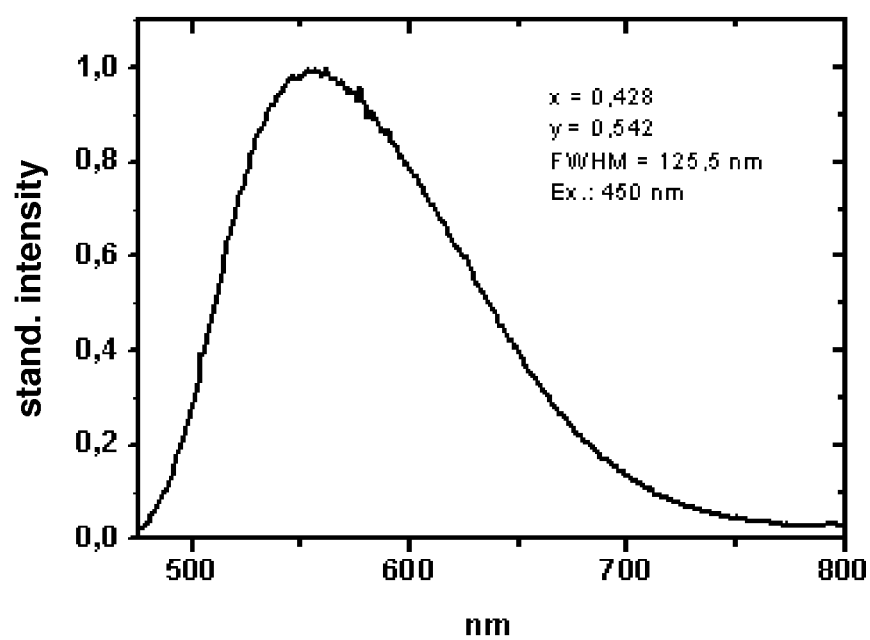
FIG. 1 shows an emission spectrum of orthosilicate mixture A. Its fluorescence band peaks are at about 568 nm.
Figure 2:
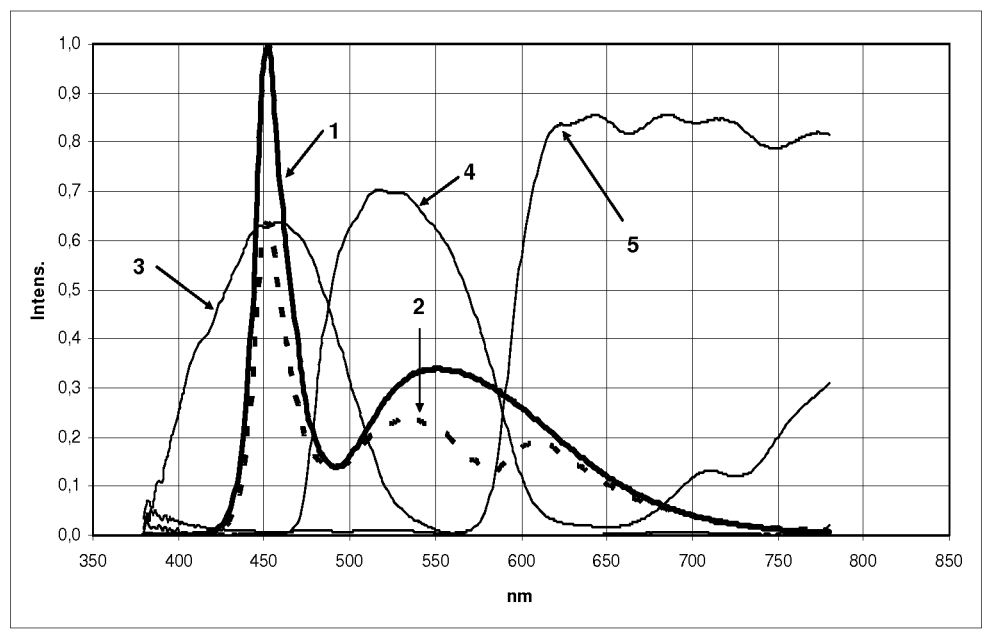
FIG. 2 shows a coloured filter transmission spectrum (3: blue transmission band, 4: green transmission band, 5: red transmission band), emission spectrum of the LED comprising orthosilicate mixture A (1: pure LED spectrum, 2: LED spectrum with coloured filter)
Figure 3:
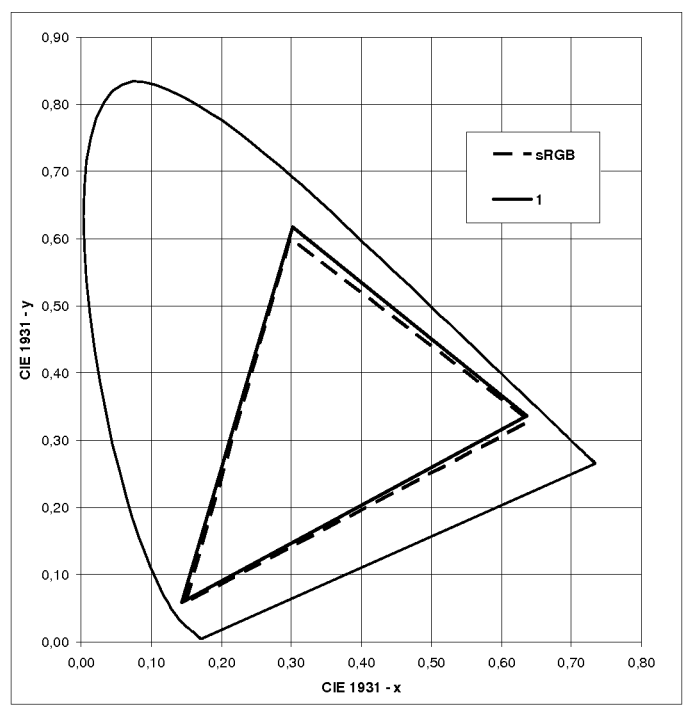
FIG. 3 shows the colour gamut coverage of the LED comprising orthosilicate mixture A in CIE 1931. The triangle represents the sRGB colour gamut, while the triangle shown in bold represents the colour gamut achieved by the combination of a standard coloured filter (FIG. 1) and an LED comprising orthosilicate mixture A (1: colour gamut of an LED comprising orthosilicate mixture A; sRGB: colour gamut of sRGB)

The invention claimed is:

1. A phosphor mixture comprising three or more silicate phosphors of the formula I $$Ba_wSr_xCa_ySiO_4:zEu \qquad (I),$$

in which all indices w, x, y and z are independent of one another, with the condition that within one compound the indices w, x, y and z add up to 2 (w+x+y+z=2), and in which one or more silicate phosphors emit green light, one or more silicate phosphors emit yellow light and one or more silicate phosphors emit orange light and in which the weight ratio of green phosphor to yellow phosphor to orange phosphor is 1.8-2.5:0.8-1.3:1.8-2.5, the green-emitting phosphor is $Ba_{w1}Sr_{x1}SiO_4$: z1 Eu, where w1=0.80 to 1.85; x1=0.10 to 1.25 and z1=0.05 to 0.20,
the yellow-emitting phosphor is $Ba_{w2}Sr_{x2}Ca_{y2}SiO_4$: z2 Eu, where w2=0.10 to 0.80; x2=1.0 to 1.80; y2=0.0 to 0.2 and z2=0.05 to 0.20,
the orange-emitting phosphor is $Ba_{w3}Sr_{x3}Ca_{y3}SiO_4$: z3Eu, where w3=0.03 to 0.10; x3=0.90 to 1.50; y3=0.20 to 0.80 and z3=0.05 to 0.20.

2. An electronic or electro-optical device comprising a phosphor mixture according to claim 1.

3. A process for the preparation of a phosphor mixture according to claim 1 in which a first silicate phosphor is mixed with one or more further phosphors.

4. A light source which comprises an indium aluminium gallium nitride semiconductor and three or more silicate phosphors comprising $Ba_wSr_xCa_ySiO_4$: 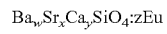
zEu, in which all indices w, x, y and z are independent of one another, with the condition that within one compound the indices w, x, y and z add up to 2 (w+x+y+z=2), and in which one or more silicate phosphors emit green light, one or more silicate phosphors emit yellow light and one or more silicate phosphors emit orange light, characterised in that the weight ratio of green phosphor to yellow phosphor to orange phosphor is 1.8 to 2.5:0.8 to 1.3:1.8 to 2.5.
the green-emitting phosphor is $Ba_{w1}Sr_{x1}SiO_4$: z1 Eu, where w1=0.80 to 1.85; x1=0.10 to 1.25 and z1=0.05 to 0.20,
the yellow-emitting phosphor is $Ba_{w2}Sr_{x2}Ca_{y2}SiO_4$: z2 Eu, where w2=0.10 to 0.80;x2=1.0 to 1.80; y2=0.0 to 0.2 and z2=0.05 to 0.20.
the orange-emitting phosphor is $Ba_{w3}Sr_{x3}Ca_{y3}SiO_4$: z3Eu, where w3=0.03 to 0.10;x3=0.90 to 1.50; y3=0.20 to 0.80 and z3=0.05 to 0.20.

5. A backlighting system having at least one light source according to claim 4.

6. A liquid-crystal display (LCD) fitted with one or more backlighting systems according to claim 5.

* * * * *